(12) United States Patent
Takahashi et al.

(10) Patent No.: US 9,301,390 B2
(45) Date of Patent: Mar. 29, 2016

(54) PROCESS FOR PRODUCING METALLIZED SUBSTRATE, AND METALLIZED SUBSTRATE

(75) Inventors: Naoto Takahashi, Shunan (JP); Yuichiro Minabe, Shunan (JP)

(73) Assignee: TOKUYAMA CORPORATION, Shunan-shi, Yamaguchi (JP)

(*) Notice: Subject to any disclaimer, the term of this patent is extended or adjusted under 35 U.S.C. 154(b) by 1096 days.

(21) Appl. No.: 13/258,185

(22) PCT Filed: Mar. 29, 2010

(86) PCT No.: PCT/JP2010/055600
§ 371 (c)(1),
(2), (4) Date: Sep. 21, 2011

(87) PCT Pub. No.: WO2010/113892
PCT Pub. Date: Oct. 7, 2010

(65) Prior Publication Data
US 2012/0015152 A1    Jan. 19, 2012

(30) Foreign Application Priority Data

Mar. 30, 2009 (JP) ................. 2009-083430
Dec. 8, 2009 (JP) ................. 2009-278658

(51) Int. Cl.
| | |
|---|---|
| H05K 1/09 | (2006.01) |
| C23C 18/06 | (2006.01) |
| C23C 18/08 | (2006.01) |
| C04B 41/52 | (2006.01) |
| H01L 23/498 | (2006.01) |
| C04B 41/00 | (2006.01) |
| C04B 41/90 | (2006.01) |
| C04B 111/00 | (2006.01) |

(52) U.S. Cl.
CPC .............. *H05K 1/092* (2013.01); *C04B 41/009* (2013.01); *C04B 41/52* (2013.01); *C04B 41/90* (2013.01); *C23C 18/06* (2013.01); *C23C 18/08* (2013.01); *H01L 23/498* (2013.01); *H01L 23/49883* (2013.01); *C04B 2111/00844* (2013.01); *H01L 2924/0002* (2013.01); *Y10T 428/24612* (2015.01)

(58) Field of Classification Search
CPC .............................. C04B 35/58; C04B 35/581
USPC ........................................................ 427/96.1
See application file for complete search history.

(56) References Cited

U.S. PATENT DOCUMENTS

| | | | |
|---|---|---|---|
| 2,570,248 A | 10/1951 | Kelley | |
| 3,641,298 A | 2/1972 | Broverman | |
| 3,681,135 A | 8/1972 | Cheary et al. | |
| 4,611,745 A * | 9/1986 | Nakahashi et al. | 228/123.1 |
| 4,729,504 A | 3/1988 | Edamura | |
| 5,151,246 A | 9/1992 | Baumeister et al. | |
| 5,354,415 A | 10/1994 | Fushii et al. | |
| 5,561,321 A | 10/1996 | Hirano et al. | |
| 5,629,559 A | 5/1997 | Miyahara | |
| 5,955,686 A | 9/1999 | Sakuraba et al. | |
| 2004/0262367 A1 * | 12/2004 | Nakamura | 228/122.1 |
| 2006/0063024 A1 | 3/2006 | Natsuhara et al. | |
| 2007/0164260 A1 * | 7/2007 | Kuwajima | 252/512 |
| 2007/0228336 A1 | 10/2007 | Uchimi et al. | |
| 2008/0020224 A1 | 1/2008 | Yamamoto et al. | |
| 2008/0131673 A1 | 6/2008 | Yamamoto et al. | |
| 2008/0131723 A1 | 6/2008 | Tucker et al. | |
| 2008/0145518 A1 | 6/2008 | Maeda et al. | |

FOREIGN PATENT DOCUMENTS

| | | | | |
|---|---|---|---|---|
| EP | 0773709 | A2 | 5/1997 | |
| JP | 62-197376 | A | 9/1987 | |
| JP | 03-101153 | A | 4/1991 | |
| JP | 4168792 | A | 6/1992 | |
| JP | 06-196831 | * | 12/1992 | ........ 427/96.1 |
| JP | 05-226515 | A * | 3/1993 | ........ 427/96.1 |
| JP | 05-170552 | A | 7/1993 | |
| JP | 05-221759 | A | 8/1993 | |
| JP | 05-226515 | A | 9/1993 | |
| JP | 05226515 | A * | 9/1993 | ........ 427/96.1 |
| JP | 06196831 | A | 7/1994 | |
| JP | 6-342853 | A | 12/1994 | |
| JP | 06-349315 | A | 12/1994 | |
| JP | 7-126701 | A | 5/1995 | |
| JP | 7-207452 | A | 8/1995 | |
| JP | H07207452 | A * | 8/1995 | ........ 427/96.1 |
| JP | 10-188671 | A | 7/1998 | |
| JP | 11307690 | A | 11/1999 | |
| JP | 2000-281460 | A | 10/2000 | |
| JP | 2008-108957 | A | 5/2008 | |
| JP | 2009-176608 | A | 8/2009 | |
| TW | 200619016 | A | 6/2006 | |
| TW | 200625989 | A | 7/2006 | |
| TW | 200635083 | A | 10/2006 | |
| WO | 2006/051881 | A1 | 5/2006 | |

OTHER PUBLICATIONS

Machine translation of JPH05-226515A.*
Machine translation for Mura et al. JP 05-226515.*
Machine translation for Sato et al. JP 06-196831.*
English Abstract for Watabe et al. JP H07-207452.*

(Continued)

*Primary Examiner* — Dah-Wei D Yuan
*Assistant Examiner* — Jose Hernandez-Diaz
(74) *Attorney, Agent, or Firm* — Ladas & Parry LLP

(57) ABSTRACT

The present invention provides a process for producing a metalized substrate in which a predetermined metal paste composition is applied onto a sintered nitride ceramic substrate (10); the resultant is fired in a heat-resistant container at a predetermined condition; and the substrate (10) and a metal layer (30) are bonded together to each other through a titanium nitride layer (20).

4 Claims, 2 Drawing Sheets

(56) References Cited

OTHER PUBLICATIONS

International Search Report: mailed Jun. 29, 2010; PCT/JP2010/055600.
International Search Report dated May 19, 2011 PCT/JP2011/054533.
USPTO RR dated Apr. 15, 2014 in connection with U.S. Appl. No. 13/581,665.
USPTO NFOA dated Jun. 30, 2014 in connection with U.S. Appl. No. 13/581,665.
USPTO FOA dated Dec. 1, 2014 in connection with U.S. Appl. No. 13/581,665.
USPTO NFOA dated Apr. 15, 2015 in connection with U.S. Appl. No. 13/581,665.
USPTO FOA dated Aug. 10, 2015 in connection with U.S. Appl. No. 13/581,665.

* cited by examiner

PROCESS FOR PRODUCING METALLIZED SUBSTRATE, AND METALLIZED SUBSTRATE

TECHNICAL FIELD

The present invention relates to a metallized substrate on which a semiconductor element is to be mounted, and a process for producing the substrate.

BACKGROUND ART

The quantity of heat generated from semiconductor elements that are to be mounted onto a wiring board or substrate has increased as the performance of the semiconductor elements has been enhanced. It is therefore desired that the wiring substrate is made of a material having a higher thermal conductivity and heat radiating performance. Hitherto, an alumina sintered body has been used as a wiring substrate material; however, the alumina sintered body does not have a sufficient thermal conductivity. Thus, studies have been made on the use of an aluminum nitride sintered body, which has a higher thermal conductivity.

In order to produce a wiring substrate using a nitride ceramic sintered body, a typical example of which is the aluminum nitride sintered body, it is necessary to form metal wiring on a surface of the nitride ceramic sintered body. Methods for forming the metal wiring include the thick film method in which a metal paste is applied, the thin film method in which a metal thin film is formed by vapor deposition, etc. For articles required to have, in particular, heat radiating performance, the thick film method is favorably adopted since the articles need a large quantity of electric current in many cases and the thickness of any film formed by the thin film method imposes a restriction onto the electric current permitted to flow in the film. However, in the thick film method, metal wiring made mainly of a high-melting-point metal, such as tungsten or molybdenum, is formed, so that the method has a problem that the resistance of the wiring is high.

It is conceivable that as the material for metal wiring, Cu, Ag or Au, or any alloy thereof is used to reduce the wiring resistance. A noble metal such as Au is expensive, and the use of only Ag as the material is disadvantageous from the viewpoint of cost. The use of only Cu as the material is disadvantageous from the viewpoint of the wiring resistance. Thus, in view of the balance among the cost, high availability, and an intentional reduction in the resistance of metal wiring, it is most desirable to use a mixture of Cu and Ag as the material for metal wiring. Cu, Ag and the like can be sintered at a lower temperature than the above-mentioned high-melting-point metals; therefore, the former metals have an advantage that the cost of energy in sintering the metals can be decreased.

Known examples of an industrial method for forming metal wiring by the thick film method include the co-firing method and the post-firing method in which a paste containing powder of a high-melting-point metal is used. The co-firing method is a method of printing a high-melting-point metal paste onto an aluminum nitride green sheet, and then firing the sheet, thereby attaining the sintering of the aluminum nitride, and the firing of the high-melting-point metal simultaneously. The method has a characteristic that although an intensely adhering metal layer can be formed, it is difficult to form a metal pattern with a high dimension precision because of shrinkage of the aluminum nitride which follows the sintering thereof. When Cu, Ag or the like is used as the wiring material, the co-firing method cannot be adopted since the sintering temperature of aluminum nitride is largely different from that of the metal paste.

The post-firing method is a method of applying a paste of a high-melting-point metal onto an aluminum nitride substrate sintered in advance, and then firing the metal. In this method, a dimension-precision-related problem as described above does not basically occur. It has been hitherto stated that the post-firing method does not easily make the bonding strength (adhesion strength) of a metal layer high. However, a post-firing method has been developed which is capable of forming a high-melting-point metal layer which adheres (onto a substrate) with a high bonding strength (see Patent Literature 1). However, a technique has not yet been industrially established in which a paste of a different metal capable of making the resistance of wiring lower, such as Cu or Ag, is used to form a metal layer on a substrate of a nitride ceramic sintered body by the post-firing method.

As a solution to this problem, Patent Literature 2 discloses an aluminum nitride substrate having an aluminum nitride sintered body, and an electroconductive metallized layer formed thereon and made of an alloy containing, as an essential component, at least one selected from titanium, zirconium and hafnium. Patent Literature 3 discloses a metallizing metal powder composition, for forming a metallized film on a ceramic substrate, which contains Cu and Ti powders as a main component, and contains at least one of Ag, Al and Zr as a secondary component, in which the content by percentage of the main component is from 90 to 99.5% by weight and that of the secondary component is from 0.5 to 10% by weight; and discloses a process for producing a metallized substrate by use of this metallizing metal powder composition.

However, these techniques have the following problems: i) the adhesion strength of the (resultant) metal layer is insufficient; i) the resistance of the metal layer is not made low as expected; (iii) the metal-platability of the metal layer is lowered because of surface-roughness of the metal layer; and iv) a pattern (of the metal layer) oozes so that the metal layer cannot cope with any fine pattern.

As a technique for solving the problem iii) of the surface roughness of the metal layer, Patent Literature 4 describes a metallizing metal- and metal-compound-powder composition which contains, as main components, a powder of at least metal selected from Cu, Ag, Au and Ag—Pd, and a metal hydride compound powder in which the metal hydride powder is at least one selected from Nb, V, Hf and Ta hydrides. The literature suggests that the reason why the smoothness of metal layers cannot be increased is that the powder of Ti therein cannot be made fine (paragraph [0009]).

Patent Literature 5 describes an aluminum nitride substrate having a metallized layer, the substrate being obtained by applying, onto a sintered aluminum nitride substrate, a paste containing a Ag—Cu alloy as a main component and titanium hydride as a secondary component, and then firing the resultant.

CITATION LIST

Patent Literature

Patent Document 1: WO 2006/051881
Patent Document 2: Japanese Patent Application Laid-Open (JP-A) No. 62-197376
Patent Document 3: JP-A No. 07-207452
Patent Document 4: JP-A No. 07-126701
Patent Document 5: JP-A No. 05-226515

SUMMARY OF INVENTION

Technical Problem

Patent Literatures 4 and 5 do not include any particular description on reducing the size of particles of titanium hydride. However, regarding titanium hydride, it is technically possible to make the size of particles thereof smaller.

However, the problems i), ii) and iv) are not solved although the surface roughness of the metal layer can be somewhat improved by making the size of particles of titanium hydride smaller. Regarding the problem iii), the improvement is insufficient too. The surface metal-platability of the metal layer is still poor.

Solution to Problems

The inventors have made eager studies on the problems to make causes for the problems evident, and found out preventive measures thereagainst. These matters are described in the following:

(1) In order to examine causes for the occurrence of the problems, the inventors have analyzed a metal layer surface of each sample produced by vacuum firing through an energy dispersive X-ray spectrometer (EDS). As a result, with regard to the samples in which the problems are caused, titanium (Ti) and oxygen (O) are detected at a relatively high concentration. From this point, the inventors have considered that a cause for the problems i) to iii) is as follows: when a metal paste composition has been vacuum-fired in an atmosphere contaminated with an oxidizing gas, the titanium component in the composition is unfavorably concentrated in the (resultant) metal layer, in particular, the front surface of the metal layer. In other words, the following cause has been considered: the titanium component in the metal paste composition turns in a state of being diffused and shifted very much when the composition is fired; when the atmosphere for the firing is not contaminated with any oxidizing gas, the titanium component reacts preferentially with nitrogen of aluminum nitride in the underlying layer (of the metal layer) so that a titanium nitride layer is formed at the interface between the metal layer and the aluminum nitride sintered body; however, when an oxidizing gas is mixed into the firing atmosphere even in a slight amount, the titanium component, which is highly reactive with the oxidizing gas, is attracted by the oxidizing gas so that the titanium component is shifted also toward the front surface of the metal layer.

If the titanium component is shifted toward the front surface of the metal layer, a titanium nitride layer is insufficiently formed to cause the problem i) that the adhesion strength is insufficient. Moreover, the titanium component remains in the metal layer, so that the resistance does not decrease, causing the problem ii). Furthermore, if the titanium component is present in the metal layer front surface, the adhering performance of plating thereto is deteriorated. Thus, even when titanium hydride powder is made finer to improve the surface roughness, the problem iii) about the metal-platability still occurs.

The inventors have considered a cause that the oxidizing gas is mixed in the vacuum-firing as follows: when the composition is fired under a vacuum inside a furnace while the temperature (of the furnace) is raised, any organic component contained in the metal paste, and decomposition products therefrom volatilize as gases (partially including an oxidizing gas) at a relatively low temperature, so that the gases adhere (or are adsorbed) onto a low-temperature region of inner wall surfaces of the furnace; however, when the temperature of the furnace is further raised for the sample-firing, the temperature of the wall surface(s) onto which these gasses adhere (or adsorbed) also rises, so that these gases are released, whereby the diffusing gases partially contact the surface of the sample even in the considerably-low-pressure atmosphere. In general, in a furnace used for firing, cooling water is used to flow to the outside of the furnace to cool the furnace in many cases in order to keep the safety of the apparatus. As a result, a distribution is generated in the inside temperature of the furnace so that a gas adhesion (adsorption)/release phenomenon as described above is caused. The matter that such a gas adhesion (adsorption)/release phenomenon is caused is verified by a change in the pressure in the furnace with time in the vacuum firing, specifically, by the following change: with a rise in the (furnace) temperature, "any organic component contained in the metal paste, and decomposition products therefrom volatilize as gases", whereby the pressure temporarily becomes high; thereafter, the pressure falls, and then when the temperature continues to be further raised, the pressure is temporarily raised again.

On the basis of the assumed mechanism, as a solution to these problems, the inventors have gotten an idea that a sample is fired in a heat-resistant container in which contamination is not caused, and have actually attempted the firing. As a result, the inventors have verified that when the vacuum-firing is performed in a heat-resistant container into which an oxidizing gas is not easily mixed from the outside, the above-mentioned problems are not easily caused; and further that in an EDS analysis of the front surface of the (resultant) metal layer, detected values of Ti and O decrease remarkably. From the above, the inventors have decided to adopt this method.

(2) A cause for the problem ii) is that when the titanium-component-containing metal paste layer has been fired, the (resultant) metal layer is not sufficiently dense. To solve this problem, the inventors have used a mixed powder of large-sized particles and small-sized particles as Cu powder.

(3) A cause for the problem iv) is that titanium hydride powder is excessively used. To solve this problem, the inventors have optimized the blending amount of a titanium hydride powder.

On the basis of the foregoing examined matters, the inventors have made the following subject matters. To make the understanding of the invention easy, reference numbers on the accompanying drawings are given in parentheses. However, the invention is not limited to any illustrated form.

A first subject matter of the present invention is a process for producing a metallized substrate (100) in which a sintered nitride ceramic substrate (10) and a metal layer (30) having a predetermined shape that covers a partial area of a surface of the substrate (10) are bonded to each other through a titanium nitride layer (20) having a thickness of 0.2 µm or more and 0.7 µm or less, comprising:

a step of preparing a metal paste composition comprising 100 parts by mass of a copper powder, 20 parts by mass or more and 60 parts by mass or less of a silver powder, and 2.0 parts by mass or more and 7.5 parts by mass or less of a titanium hydride powder, the copper powder being a mixed powder of a copper powder having an average particle size of 1.0 µm or more and 5.0 µm or less, and a copper powder having an average particle size of 0.2 µm or more and 0.6 µm or less, the silver powder having an average particle size of 0.1 µm or more and 1.0 µm or less, and the titanium hydride powder having an average particle size of 1.0 µm or more and 7.0 µm or less;

a first-precursor-substrate (110)-forming step of applying the metal paste composition to the sintered nitride ceramic substrate (10), thereby forming a first precursor substrate having the sintered nitride ceramic substrate (10), and a metal paste layer (50) comprising the metal paste composition, which is formed over the substrate (10), and which has a shape turning into the above-mentioned predetermined shape after the precursor substrate is fired; and a firing step of holding the first precursor substrate (110) in a heat-resistant container, and firing the substrate at a temperature of 800° C. or more and 950° C. or less and under a pressure of $1.33\times10^{-5}$ Pa or more and $1.33\times10^{-2}$ Pa or less, wherein in the firing step, the titanium component contained in the metal paste layer is caused to react preferentially with a nitride ceramic that constitutes the sintered nitride ceramic substrate (10), thereby forming the titanium nitride layer (20); and further the content of titanium in the metal layer (30) obtained after the firing is set to 2.0% by mass or less, and further is set to ½ or less of the amount of titanium contained in the metal paste layer.

According to the metal paste composition of the first subject matter of the present invention, the ratio (a/b) of the mass (a) of the silver powder the average particle size of which is from 0.1 µm or more and 1.0 µm or less, to the mass (b) of the copper powder the average particle size of which is from 0.2 µm or more and 0.6 µm or less, is preferably from 0.4 or more and 5.0 or less. The ratio (c/b) of the mass (c) of the copper powder the average particle size of which is from 1.0 µm or more and 5.0 µm or less, to the mass (b) of the copper powder the average particle size of which is preferably from 0.2 µm or more and 0.6 µm or less, is preferably from 0.5 or more and 15.0 or less.

A second subject matter of the present invention is a metallized substrate (100) produced by the process according to the first subject matter of the present invention.

A third subject matter of the present invention is a process for producing a metallized substrate (102) in which a sintered nitride ceramic substrate (10) and a metal layer (32) having a predetermined shape that covers a partial area of a surface of the substrate (10) are bonded to each other through a titanium nitride layer (22) having a thickness of 0.2 µm or more and 0.7 µm or less, comprising:

a step of preparing a first metal paste composition comprising 100 parts by mass of a copper powder, 20 parts by mass or more and 60 parts by mass or less of a silver powder, and 2.0 parts by mass or more and 10.0 parts by mass or less of a titanium hydride powder, the copper powder being a mixed powder of a copper powder having an average particle size of 1.0 µm or more and 5.0 µm or less, and a copper powder having an average particle size of 0.2 µm or more and 0.6 µm or less, the silver powder having an average particle size of 0.1 µm or more and 1.0 µm or less, and the titanium hydride powder having an average particle size of 1.0 µm or more and 7.0 µm or less;

a step of preparing a second metal paste composition containing a copper powder and a silver powder but containing no titanium component;

a second-precursor-substrate (112)-forming step of applying, to the sintered nitride ceramic substrate (10), the first metal paste composition and the second metal paste composition successively, thereby forming a second precursor substrate (112) having the sintered nitride ceramic substrate (10), and a metal paste layer which is formed over the substrate (10), which has a shape turning into the above-mentioned predetermined shape after the precursor substrate is fired, and which comprises a laminate of a first metal paste layer (52) comprising the first metal paste composition, and a second metal paste layer (54) comprising the second metal paste composition; and a firing step of holding the second precursor substrate (112) in a heat-resistant container, and then firing the substrate at a temperature of 800° C. or more and 950° C. or less under a pressure of $1.33\times10^{-5}$ Pa or more and $1.33\times10^{-2}$ Pa or less, wherein in the firing step, the titanium component contained in the first metal paste layer is caused to react preferentially with a nitride ceramic that constitutes the sintered nitride ceramic substrate (10), thereby forming the titanium nitride layer (22); and further the content of titanium in the metal layer (32) obtained after the firing is set to 2.0% by mass or less, and further is set to ½ or less of the amount of titanium contained in the first metal paste layer.

In the first metal paste composition in the third aspect of the present invention, the ratio (a/b) of the mass (a) of the silver powder the average particle size of which is from 0.1 pin or more and 1.0 µm or less, to the mass (b) of the copper powder the average particle size of which is from 0.2 µm or more and 0.6 µm or less, is preferably from 0.4 or more and 5.0 or less. The ratio (c/b) of the mass (c) of the copper powder the average particle size of which is from 1.0 µm or more and 5.0 µm or less to the mass (b) of the copper powder the average particle size of which is from 0.2 µm or more and 0.6 µm or less, is preferably from 0.5 or more and 15.0 or less.

A fourth subject matter of the present invention is a metallized substrate (102) produced by the process according to the second subject matter of the present invention.

Advantageous Effects of Invention

According to the process of the first subject matter of the present invention for producing the metallized substrate (100), the metal paste layer (50) is fired in an atmosphere not contaminated, thereby preventing the titanium component from diffusing into the metal layer (30). Thus, the titanium nitride layer (20) is sufficiently formed at the interface between the metal layer (30) and the nitride ceramic sintered body (10) so that the adhesive property of the metal layer (30) can be better, thus lowering the resistance value of the metal layer (30), and making the metal-platability of the front surface better. The use of the metal paste composition including the copper powders having the two particle sizes, which are large and small particle sizes, makes the metal layer (30) sufficiently dense through the firing. Thus, the electroconductivity of the metal layer (30) becomes good. Additionally, the content of the titanium hydride powder in the metal paste composition is specified into the predetermined amount, so that the metal layer (30) can be made into a fine pattern.

According to the process of the third subject matter of the present invention for producing the metallized substrate (102), the advantageous effects according to the first subject matter are obtained; and further the titanium component can be effectively prevented from shifting toward the front surface of the metal layer (32) since the second metal paste layer (54), which contains no titanium component, is formed over the first metal paste layer (52), which contains the titanium component, and then the resultant is fired. Thus, the electroconductivity of the metal layer (32) can be further improved, and further the surface roughness and the metal-platability of the metal layer (32) can be improved.

Figure 1:
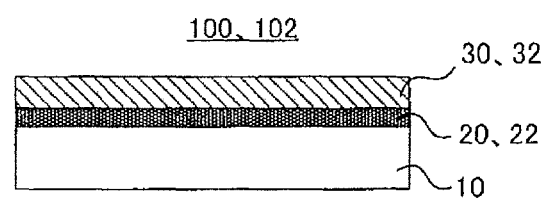
FIG. 1 is a schematic view illustrating the layer structure of a metallized substrate 100, 102 of the present invention.

DESCRIPTION OF THE SYMBOLS 100, 102 metallized substrate
110 first precursor substrate 112 second precursor substrate
10 sintered nitride ceramic substrate
20, 22 titanium nitride layer
30, 32 metal layer
50 metal paste layer
52 first metal paste layer
54 second metal paste layer Description of Embodiments The first subject matter of the present invention is a process of applying a predetermined paste composition to a sintered nitride ceramic substrate to form a first precursor substrate, and then firing this substrate under predetermined conditions to produce a metallized substrate (the second subject matter of the present invention). The third subject matter of the present invention is a process of applying, to a sintered nitride ceramic substrate, a first metal paste composition and a second metal paste composition successively to form a second precursor substrate, and then firing this substrate under predetermined conditions to produce a metallized substrate (the fourth subject matter of the present invention).

<Metallized Substrate 100, 102>

A description is first made of metallized substrates 100 and 102 produced by the first and third subject matters of the present invention, respectively. As illustrated in FIG. 1, which is a schematic view of the layer structure (of each of the substrates), the metallized substrate 100 is formed to have, on a sintered nitride ceramic substrate 10, a titanium nitride layer 20 and a metal layer 30 in this order. Moreover, the metallized substrate 102 is formed to have, on the sintered nitride ceramic substrate 10, a titanium nitride layer 22 and a metal layer 32 in this order.

(Sintered Nitride Ceramic Substrate 10)

The sintered nitride ceramic substrate 10 may be formed by a known method of firing a nitride ceramic green sheet having a predetermined shape or a pressure-formed body obtained by forming nitride ceramic grains into a shape under pressure. The shape, the thickness and other properties thereof are not particularly limited. The material of the sintered body may contain an ordinarily-used sintering aid, such as a rare earth oxide. A surface of the sintered nitride ceramic substrate 10 may be polished if necessary to make the surface smooth. Examples of the nitride ceramic include aluminum nitride, silicon nitride, boron nitride, zirconium nitride, titanium nitride, tantalum nitride, and niobium nitride. It is particularly preferred to use aluminum nitride, which has high thermal conductivity, and other properties.

(Titanium Nitride Layer 20, 22)

The titanium nitride layer 20 formed in the process of the first subject matter of the present invention is a layer formed between the sintered nitride ceramic substrate 10 and the metal layer 30 by applying a titanium-component-containing metal paste composition onto the sintered nitride ceramic substrate 10, and then firing the resultant. The titanium nitride layer 20 is formed at the interface between the sintered nitride ceramic substrate 10 and the metal layer 30 by reaction between the titanium component in the metal paste composition and the nitrogen component in the sintered nitride ceramic substrate 10. It has been verified that the reaction of titanium with the sintered aluminum nitride advances very promptly so that the wettability is good. It appears that the titanium nitride layer 20 is formed, whereby the adhesive property of the metal layer 30 becomes strong.

The titanium nitride layer 22 formed by the process of the third subject matter of the present invention is formed at the interface between the sintered nitride ceramic substrate 10 and the metal layer 32 by reaction between the titanium component in a first metal paste layer 52 and the nitrogen component in the sintered nitride ceramic substrate 10. Advantageous effects produced by the formation of the titanium nitride layer 22 are the same as those by the formation of the titanium nitride layer 20.

The titanium nitride layer 20, 22 may contain copper, silver, ceramic component or some component other than titanium nitride. The titanium nitride layer 20, 22 contains titanium nitride in a proportion of 50% or more, preferably 70% or more by mass of the whole of the layer 20, 22 (the proportion of the whole: 100% by mass). The thickness of the titanium nitride layer 20, 22 is not particularly limited. In order to make the adhesive property of the metallized layer (formed thereon) good, the lower limit thereof is 0.05 µm or more, preferably 0.10 µm or more, more preferably 0.20 µm or more. The upper limit is not particularly limited, and is usually 3.0 µm or less, preferably 2.0 µm or less, more preferably 0.7 µm or less in light of an actual production thereof. The thickness of the titanium nitride layer 20, 22 can be made clear by observing a cross section of the metallized substrate 100, 102 through an electron microscope.

(Metal Layer 30, 32)

In the first subject matter of the present invention, the metal layer 30 is formed on the titanium nitride layer 20 by applying a metal paste composition onto the sintered nitride ceramic substrate 10 to obtain a first precursor substrate 110, and firing the substrate 110.

In the third subject matter of the present invention, the metal layer 32 is formed on the titanium nitride layer 22 by laminating the first metal paste layer 52 onto the sintered nitride ceramic substrate 10, laminating a second metal paste layer 54 further onto the first metal paste layer 52 to obtain a second precursor substrate 112, and then firing the substrate 112.

The metal layer 30, 32 contains silver in an amount of 15 parts by mass or more and 80 parts by mass or less, preferably 20 parts by mass or more and 60 parts by mass or less for 100 parts by mass of copper, and contains titanium in an amount of 5.0 parts by mass or less, preferably 3.0 parts by mass or less therefor.

The content of titanium in the metal layer 30, 32 is 2.0% or less by mass, preferably 1.5% or less by mass, and is further ½ or less, preferably ⅓ or less of the amount (mass) of titanium contained in the metal paste layer 50 or the first metal paste layer 52.

If the silver content is too small, the resistance of the metal layer 30, 32 may increase. In reverse, if the silver content is too large, the costs for the material increase and a precise wiring pattern may not be formed probably because the melting point of the metal layer 30, 32 becomes low. When the silver content is made large within the above-mentioned range, the following advantageous effects are produced: voids are decreased in the metal layer 30, 32; and the resistance value of the metal layer 30, 32 can be lowered.

In the present invention, the first precursor substrate 110 composed of the sintered nitride ceramic substrate 10 and the metal paste layer 50, or the second precursor substrate 112 composed of the sintered nitride ceramic substrate 10, the first metal paste layer 52 and the second metal paste layer 54, is fired in a heat-resistant container under a condition that the inside thereof is not contaminated with any oxidizing gas. In this way, the shift of the titanium component toward the metal layer 30, 32 is restricted. Thus, the titanium content in the metal layer 30, 32 can be decreased as described above. If the titanium content is too large, the resistance of the metal layer 30, 32 becomes high. Additionally, the wettability of a liquid phase generated at the time of the firing is excessively improved so that components of the liquid phase ooze from the (resultant) wiring pattern; thus, the formed wiring pattern may not be a precise wiring pattern. The lower limit of the titanium content is not particularly limited, and is preferably 0% by mass. However, when the present metallized substrate is actually produced, the content is usually 0.2% or more by mass, and may be 0.5% or more by mass in some cases.

The above-mentioned ratio by mass between the constituting components of the metal layer 30, 32 is based on values calculated from analysis of the produced metallized substrate 100, 102. The ratio by mass may be analyzed from the metallized substrate 100, 102 by dissolving only the metal layer 30, 32 (the region of the titanium nitride layer 20, 22 is excluded) by etching treatment with an acid or some other, and then analyzing the resultant solution. About the thickness of the metal layer 30, 32, the lower limit is preferably 3 μm or more, more preferably 5 μm or more to make the electroconductivity of the wiring pattern good. The upper limit is not particularly limited, and is preferably 200 μm or less, more preferably 100 μm or less for the following reason: if the metal layer 30, 32, is too thick, the effect of improving the electroconductivity is saturated and further a precise wiring is not easily formed.

In the present invention, the firing is performed in a heat-resistant container under a condition that the inside the container is not contaminated with any oxidizing gas, thereby restricting the shift of the titanium component toward the front surface of the metal layer 30, 32; thus, the titanium concentration can be lowered in the front layer region of the metal layer 30, 32. The titanium concentration in the front layer region of the metal layer 30, 32 is a concentration permitting the ratio (B/A) of the sum (A) of the concentrations by mass of copper and silver to the concentration (B) by mass of titanium, to 0.20 or less, preferably 0.15 or less, more preferably 0.13 or less, the concentrations being obtained when energy dispersive X-ray spectrometry (EDS) is used to make a measurement at an electron beam accelerating voltage of 10 kV. If the titanium concentration in the front surface region of the metal layer 30, 32 is out of the range to be too high, the front surface of the metal layer 30, 32 discolors so that the adhesive property between the plating layer and the metal layer 30, 32 declines. In the case of adopting a general firing method in a conventional process for producing a metallized substrate to fire a metal paste layer on a sintered body substrate, the front surface of the metal layer has discolored; thus, according to an ordinary pre-treating method for plating, a sufficient adhesive property cannot be obtained between the metal layer and a plating layer (formed thereon). Therefore, in order to form a plating layer having a good adhesive property, it is necessary to treat the front surface of the metal layer by physical polishing or some other. The value of the ratio B/A is more preferably closer to zero. In light of a production limitation, the lower limit is 0.01 or more, and may be 0.03 or more in some cases.

As will be described later, in the first and third subject matter of the present invention, a specified firing method is adopted. This method can set the value of the ratio B/A into the above-mentioned preferred range. The inventors are of the opinion that the discoloration of the front surface of the metal layer 30, 32 is caused by the oxidization of titanium present in the front surface of the metal layer 30, 32. Thus, according to the conventional metallized-substrate-producing process, in the firing step thereof, titanium in a metal layer shifts to the front surface of the metal layer, so that the front surface of the substrate is oxidized by a very small amount of impurities in the atmosphere, whereby one or more titanium oxides segregate in the front surface of the metal layer. It therefore appears that the titanium concentration in the vicinity of the front surface of the metal layer increases so that the value of the ratio B/A becomes high.

In the first and third subject matter of the present invention, the adoption of the specified firing method prevents the shift of titanium to the front surface of the metal layer 30, 32, so that the titanium nitride layer 20, 22 is sufficiently formed. Thus, the adhesive property of the metal layer 30, 32 becomes better than in the case of conventional metallized substrates. Even about the metallized substrates obtained by the conventional method, by treating their discolored surface by etching, polishing or the like, the value of the ratio B/A in the metal layer front surface can be adjusted into the above-mentioned preferred range. However, in such a substrate, the titanium nitride layer 20, 22 is not sufficiently formed thereon so that the adhesive property of its metal layer 30, 32 is still insufficient.

In the process of the present invention, the value of the ratio B/A can be set into the above-mentioned range while the metal layer 30, 32 is kept as it is, after formed, without subjecting the front surface of the metal layer 30, 32 to polishing or any other. In the metallized substrate 100, 102 of the present invention, by treating the front surface of the metal layer 30, 32 by etching or polishing, the titanium concentration in the front surface of the metal layer 30, 32 can be further decreased in order to improve the metal-platability of the front surface further.

In the third subject matter of the present invention, the second metal paste layer 54, which contains no titanium hydride powder, is formed on the first metal paste layer 52, and the resultant is fired to form the metal layer 32, so that the shift of titanium to the front surface of the metal layer 32 is further restrained. For this reason, the value of the ratio B/A can be made smaller and can be favorably set to 0.10 or less.

(Adhesion Strength and Electroconductivity of Metallized Substrate 100, 102)

In the metallized substrate 100, 102 produced by the first subject matter of the present invention, and the third subject matter thereof, the titanium nitride layer 20, 22 is formed between the sintered nitride ceramic substrate 10 and the metal layer 30, 32, as described above. Thus, the adhesion strength of the metal layer 30, 32 can be made high. The metallized substrate 100, 102 can be formed to have an adhesion strength of 50 N or more, preferably 80 N or more, more preferably 90 N or more, even more preferably 100 N or more.

As described above, in the metallized substrate 102 produced by the third subject matter of the present invention, the second metal paste layer 54, which contains no titanium hydride powder, is formed on the first metal paste layer 52, and the resultant is fired to form the metal layer 32, so that the shift of titanium to the front surface of the metal layer 32 is further restrained. For this reason, the titanium nitride layer 22 can be sufficiently formed, so that the adhesion strength of the metal layer 32 can be made higher. Thus, the adhesion strength of the metal layer 32 in the metallized substrate 102 can be set to, in particular, 110 N or more.

About the bonding strength of a wiring pattern (of any sample), a nail head pin is used which is made of 42 alloy and has a tip diameter of 1.1 mm, the surface of the tip being plated with nickel; the front surface of the metal layer 30, 32 of the metallized substrate 100 (as the sample), 102 is plated with Ni/Au; and the nail head pin is bonded, into a vertical form, to this plating film through Pb—Sn solder, and this nail head pin is pulled in the vertical direction at a rate of 10 mm/min. The load shown when the nail head pin is peeled out is defined as the bonding strength.

In the metallized substrate 100, 102 of the present invention, the titanium content in the metal layer 30, 32 is set to the predetermined amount or less, silver is contained in the predetermined amount, and further voids in the metal layer 30, 32 are decreased, whereby the electroconductivity can be improved. The volume resistivity thereof measured by the four-terminal method can be set to $10.0\times10^{-8}$ Ωm or less, preferably $7.5\times10^{-8}$ Ωm or less, more preferably $7.0\times10^{-8}$ Ωm or less.

As described above, in the third subject matter of the present invention, the titanium component in the metal layer 32 is further deceased by the presence of the second metal paste layer 54 so that the electroconductivity of the metal layer 32 is improved. Thus, the volume resistivity can be set more preferably to $6.0\times10^{-8}$ Ωm or less, in particular preferably to $5.0\times10^{-8}$ Ωm or less.

<Process of the First Subject Matter of the Present Invention for Producing Metallized Substrate>

Figure 2:
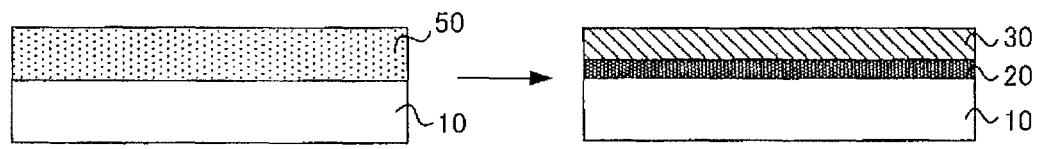
FIG. 2 is a schematic view illustrating steps in a process for producing the metallized substrate 100 according the first subject matter of the present invention.

Hereinafter, the process of the first subject matter of the present invention for producing the metallized substrate 100 is described in the order of steps therein. FIG. 2 schematically illustrates steps in the process of the first subject matter of the present invention. The process of the first subject matter of the present invention includes the step of preparing a metal paste composition, the step of applying the metal paste composition to a sintered nitride ceramic substrate 10 to form a first precursor substrate 110, and the step of firing the first precursor substrate.

(Step of Preparing Metal Paste Composition)

The metal paste composition for forming the metal paste layer 50 contains a copper powder, a silver powder, and a titanium hydride powder, and preferably contains a binder and a solvent. About high-melting-point pastes that have been hitherto used to form an AlN metallized substrate, aluminum nitride powder is added thereto, thereby improving the adhesive property between the resultant high-melting-point metal layer and the (concerned) sintered aluminum nitride substrate. However, it is unnecessary to add any ceramic powder to the paste composition in the present invention. As a result thereof, a ceramic component, which is an insulating component, is not present so that the metal layer 30 to be formed turns better in electroconductivity.

The metal paste composition contains the silver powder in an amount of 15 parts by mass or more and 80 parts by mass or less, preferably 20 parts by mass or more and 60 parts by mass or less for 100 parts by mass of the copper powder, and contains the titanium hydride powder in an amount within a range the lower limit of which is 1.0 part by mass or more, preferably 2.0 parts by mass or more, and the upper limit of which is 13.0 parts by mass or less, preferably 10.0 parts by mass or less, more preferably 7.5 parts by mass or less, in particular preferably 7.0 parts by mass or less therefor.

The copper powder in the metal paste composition is preferably a mixture of powders having two average particle sizes of large and small ones, respectively. The average particle size of the large-size copper powder is preferably from 1.0 μm or more and 5.0 μm or less, more preferably from 1.5 μm or more and 3.0 μm or less, and that of the small-size copper powder is preferably from 0.1 μm or more and 1.0 μm or less, more preferably from 0.2 μm or more and 0.6 μm or less. The average particle size of the silver powder is preferably from 0.1 μm or more and 1.0 μm or less, more preferably from 0.2 μm or more and 0.8 μm or less. About the average particle size of the titanium hydride powder, the lower limit is preferably 0.1 μm or more, more preferably 0.5 μm or more, even more preferably 1.0 μm or more, and the upper limit is preferably 20.0 μm or less, more preferably 10.0 μm or less, even more preferably 7.0 μm or less.

By the use of the metal paste composition, which contains the copper and the silver powders having the above-mentioned particle sizes, the metal paste layer 50 can be formed to have a structure in which the metal powders are filled into a high density; additionally, when the composition is fired, a liquid phase is quickly and evenly produced. Thus, a dense metal layer 30 can be formed. When the metal layer 30 can be made dense in this way, the following inconveniences and others can be prevented: when a plating layer is formed on the metal layer 30, the (concerned) plating solution penetrates into the metal paste layer 30 and remains in the metal layer 30, whereby the metal layer 30 is discolored; and the plating film swells when the workpiece including the plating film is heated. Any one of the above-mentioned average particle sizes is the median size obtained by measuring the laser diffracting/scattering method by use of an instrument, Microtrac HRA, manufactured by Nikkiso Co., Ltd. (the same shall be applied to any other average particle size referred to in the present specification).

In the metal paste composition, the ratio (a/b) of the mass (a) of the silver powder the average particle size of which is from 0.1 μm or more and 1.0 μm or less, to the mass (b) of the copper powder the average particle size of which is from 0.1 μm or more and 1.0 μm or less (preferably from 0.2 μm or more and 0.6 μm or less), is preferably from 0.4 or more and 5.0 or less. When the ratio a/b is set into this range, the metal layer 30 can be made dense. Furthermore, considering the printability (of the composition), and properties of the resultant metallized substrate 110, the ratio is preferably from 0.5 or more and 4.5 or less, more preferably from 0.5 or more and 4.0 or less.

The ratio (c/b) of the mass (c) of the copper powder the average particle size of which is from 1.0 μm or more and 5.0 μm or less, to the mass (b) of the copper powder the average particle size of which is from 0.1 μm or more and 1.0 μm or less (preferably from 0.2 μm or more and 0.6 μm or less), c/b, is from 0.5 or more and 15.0 or less, more preferably from 1.0 or more and 12.0 or less. When the ratio c/b is set into this range, the metal layer 30 can be made dense so that a fine wiring pattern can be formed.

The binder contained in the metal paste composition may be any known binder, which may be used without any especial restriction. Examples thereof include acrylic resins such as polyacrylates, and polymethacrylates, cellulose resins such as methylcellulose, hydroxymethylcellulose, ethylcellulose, nitrocellulose and cellulose acetate butyrate, and vinyl-group-containing resins such as polyvinyl butyral, polyvinyl alcohol, and polyvinyl acetate. In order to improve the printability and others (of the composition), two or more resins may be used in a mixture form. Of the above-mentioned examples, acrylic resins are most preferred since each of the resins gives only a small amount of residues when the workpiece including the resin is fired in an inert atmosphere.

The solvent contained in the metal paste composition may be any known solvent, which may be used without any especial restriction. Examples of the solven include toluene, ethyl acetate, terpineol, butyl carbitolacetate, and texanol. A surfactant, a plasticizer and/or some other that is/are known may be added thereto in order to improve the print suitability, the storage stability and others. A dispersing agent that can be favorably used is, for example, a phosphate type, or polycarboxylic acid type agent.

(Step of Forming First Precursor Substrate 110)

The metal paste composition prepared in the above-mentioned step is applied onto a sintered nitride ceramic substrate 10, so as to have a shape permitting the metal layer 30 obtained after the composition is fired to turn into a desired metal layer. In this way, a metal paste layer 50 is formed to produce a first precursor substrate 110 composed of the substrate 10 and the metal paste layer 50. The application of the metal paste composition is preferably performed by printing in order to form a fine wiring. The printing may be screen printing, ink-jet printing, offset printing or some other. The paste needs only to be appropriately adjusted into an optimal viscosity in accordance with the used printing method. When screen printing is used, it is preferred to use a metal paste in which the amounts of individual components are adjusted to set the viscosity thereof into the range of 50 to 400 Pas at 25° C., considering the operability (of the printing) and the reproducibility of a pattern (to be formed).

(Firing Step)

In the firing step, the first precursor substrate 110 produced in the above-mentioned step, which is composed of the sintered nitride ceramic substrate 10 and the metal paste layer 50, is held in a heat-resistant container, and fired in a non-oxidizing atmosphere. In this way, a titanium nitride layer 20, and a layer as the above-mentioned metal paste layer 30 are formed on the sintered nitride ceramic substrate 10.

The non-oxidizing atmosphere may be a vacuum atmosphere, or an atmosphere of an inert gas such as argon gas or helium gas, or a hydrogen gas atmosphere. The atmosphere may be a mixed atmosphere of an inert gas and hydrogen gas. It is preferred to adopt, out of these non-oxidizing atmospheres, a vacuum atmosphere, or an atmosphere of a mixed gas of an inert gas and hydrogen gas. When the substrate is fired in a vacuum, the vacuum degree is preferably as high as possible to prevent a reactive gas, such as oxygen or nitrogen, in the atmosphere from reacting with titanium. The lower limit of the vacuum degree (the upper limit of the pressure) is preferably $1.33 \times 10^{-1}$ Pa, more preferably $1.33 \times 10^{-2}$ Pa. The upper limit of the vacuum degree (the lower limit of the pressure) is not particularly limited, and is $1.33 \times 10^{-5}$ Pa, considering industrial manufacture.

In the present invention, it is preferred to fire the first precursor substrate inside a heat-resistant container in the non-oxidizing atmosphere. This heat-resistant container needs only to be made of a material resisting sufficiently against the temperature when the first precursor substrate 110 is fired. The container is preferably a container which has no gas-permeability, generates no gas by itself, and has high air-tightness even at high temperatures in the firing. Specific examples of a material that is preferably usable for this heat-resistant container include a sintered body made of a nitride such as aluminum nitride, boron nitride or silicon nitride, a sintered body of an oxide such as alumina, magnesia, or zirconia, a heat-resistant alloy such as Incoloy or Hastelloy, and quartz glass. Of these examples, a nitride sintered body, which is excellent in thermal conductivity, is preferred since this material keeps heat-evenness of the inside of the container certainly when the substrate is fired.

This heat-resistant container would fulfill a role of: blocking the atmosphere near the first precursor substrate 110 in the firing step from the other atmosphere inside the firing furnace; and restraining a decomposition product and other pollution sources, which result from a matter that the binder in the metal paste composition is decomposed or scattered to adhere again onto walls of the furnace or onto some other, from being again scattered with a rise in the inside temperature of the firing furnace to react with the titanium component in the paste layer 50. It is therefore preferred that this heat-resistant container has a structure capable of being lidded so as to block the atmosphere near the first precursor 110 in the firing step from the other atmosphere in the firing furnace. The heat-resistant container may be a container which can be made into a complete sealed state. However, the container may have a gap permitting a gas generated by thermal decomposition of the binder in the paste layer 50 to be discharged to the outside of the container. The shape of the heat-resistant container preferably has a size that does not permit a distribution in the inside temperature of the heat-resistant container to be generated inside the firing furnace. From this matter as well, it is preferred that the heat-resistant container be a container made of a nitride sintered body, which is excellent in thermal conductivity.

In the present invention, the first precursor 110 is held in the heat-resistant container, and vacuum-fired in a non-oxidizing atmosphere, preferably under a pressure of $1.33 \times 10^{-1}$ to $1.33 \times 10^{-3}$ Pa, more preferably $1.33 \times 10^{2}$ to $1.33 \times 10^{-5}$ Pa while an oxidizing gas is prevented from being mixed thereinto, thereby preventing titanium in the metal paste layer 50 from shifting to the front surface of the metal layer 30. Thus, the titanium component contained in the metal paste layer is caused to react preferentially with the nitride ceramic constituting the sintered nitride ceramic substrate, and further the content of titanium in the metal layer obtained after the firing can be set to 2.0% or less by mass and further ½ or less of the amount of titanium contained in the metal paste layer. In this way, the titanium nitride layer 20 is sufficiently formed and the adhesive property of the metal layer 30 can be made good. As will be later described in Examples, even when metal paste compositions having the same composition are used, a product obtained by firing one of the compositions in a heat-resistant container made of an aluminum nitride sintered body makes it possible to decrease the titanium concentration in the front surface of the metal layer 30, decrease the volume resistivity of the metal layer 30 and improve the bonding strength.

The firing may be performed at a temperature not higher than the melting point (1083° C.) of copper since the metal paste composition contains silver component. In order to form a highly precise fine wiring pattern, the firing is performed preferably at a temperature of 800° C. or more and 950° C. or less. When the firing temperature is made high within the firing temperature range, produced is an advantageous effect that voids are decreased in the metal layer 30. The firing period may be appropriately decided in accordance with a (desired) wiring pattern and film thickness, and some other. It is sufficient (for the firing) to keep the above-mentioned temperature range for a period from several tens of seconds to one hour.

<Process of the Third Subject Matter of the Present Invention for Producing Metallized Substrate 102>

Figure 3:
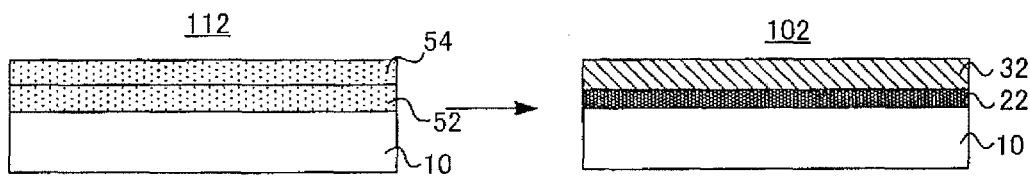
FIG. 3 is a schematic view illustrating steps of a process for producing the metallized substrate 102 according the third subject matter of the present invention.

As is schematically illustrated in FIG. 3 about the process for producing a metallized substrate 102, in the process of the third subject matter of the present invention for producing the metallized substrate 102, a first metal paste composition and a second metal paste composition are prepared first. The first metal paste composition and the second metal paste composition are successively applied onto a sintered nitride ceramic substrate 10 to form a first metal paste layer 52 and a second metal paste layer 54. In this way, a second precursor substrate 112 is formed, and then the second precursor substrate 112 is fired, thereby producing the metallized substrate 102.

The sintered nitride ceramic substrate 10 may be the same as in the process of the first subject matter of the present invention for producing the metallized substrate 100.

(Step of Preparing First Metal Paste Composition and Second Metal Paste Composition)

The first metal paste composition for forming the first metal paste layer 52 contains a copper powder, a silver powder, and a titanium hydride powder, and preferably contains a binder, a dispersing agent and a solvent. The second metal paste composition for forming the second metal paste layer 54 contains a copper powder, and a silver powder. In the same manner as described above, the composition preferably contains a binder, a dispersing agent and a solvent. The second metal paste composition contains no titanium component. About high-melting-point pastes that have been hitherto used to form an AlN metallized substrate, aluminum nitride powder is added thereto, thereby improving the adhesive property between the resultant high-melting-point metal layer and the (concerned) sintered aluminum nitride substrate. However, it is unnecessary to add any ceramic powder to the paste composition in the present invention. As a result thereof, a ceramic component, which is an insulating component, is not present so that the metal layer 32 to be formed turns better in electro-conductivity.

In the case of regarding, as 100 parts by mass, the total amount of the copper powders and the silver powders in all the metal paste compositions, which form the first and second metal paste layers 52 and 54, respectively, it is preferred to set the amount of the titanium hydride powder in the first metal paste composition, which forms the first metal paste layer 20, into the range of 1 part by mass or more and 10 parts by mass or less, in particular 1 part by mass or more and 5 parts by mass or less. If the amount of the titanium hydride powder is too small, the adhesive property of the metal layer 32 after the firing may be poor. By contrast, if the amount of the titanium hydride powder is too large, the effect of improving the adhesive property is saturated and further the resistance of the metal layer 32 becomes high. Additionally, the wettability of a liquid phase generated at the time of the firing is excessively improved so that the liquid phase components ooze from the (resultant) wiring pattern; thus, the formed wiring pattern may not be a precise wiring pattern. The reason why the total amount of the copper powders and the silver powders in all the paste compositions, which form the first and second metal paste layers 52 and 54, is used as a basis is that the blend amount of the titanium hydride powder in the first metal paste layer 52 can be increased when the second metal paste layer 54 can be thickly formed.

In each of the first and second metal paste layers 52 and 54, the ratio by mass between the silver powder and the copper powder (the silver powder/the copper powder) is preferably from 0.15 or more and 0.8 or less. If the amount of the silver powder is too small, the resistance of the metal layer 32 may become high. In reverse, if the silver content is too large, the costs for the material become high. Additionally, a precise wiring pattern may not be formed probably because the melting point of the metal layer 32 becomes low. When the silver content is made large within the above-mentioned range, produced are advantageous effects that voids are decreased in the metal layer 32; and the resistance value of the metal layer 32 can be lowered.

When the ratio by mass between the silver powder and the copper powder in the first metal paste layer 52, and that in the second metal paste layer 54 are in the above-mentioned respective ranges, the ratios may be different from each other. If the second metal paste layer 54 is formed to be made only of copper, whereby the resultant ratio therebetween is out of the above-mentioned range, voids may be generated in the metal layer 32. This appears to be due to the reason that silver in the first metal paste layer 52 shifts toward the second metal paste layer 54, that is, toward the front surface of the metal layer 32 by the firing.

Specifically, the first metal paste composition contains the silver powder in an amount of 15 parts by mass or more and 80 parts by mass or less, preferably 20 parts by mass or more and 60 parts by mass or less for 100 parts by mass of the copper powder, and contains the titanium hydride powder in an amount within a range the lower limit of which is 1.0 part by mass or more, preferably 2.0 parts by mass or more, and the upper limit of which is preferably 20.0 parts by mass or less, more preferably 15.0 parts by mass or less, even more preferably 10.0 parts by mass or less therefor.

The second metal paste composition contains the silver powder in an amount of preferably 15 parts by mass or more and 80 parts by mass or less, more preferably 20 parts by mass or more and 60 parts by mass or less for 100 parts by mass of the copper powder.

The average particle size of the copper powder in each of the first and second metal paste compositions is not particularly limited, and may be the same particle size as copper powders used in conventional pastes. Specifically, as the copper powder, a copper powder having an average particle size of 0.1 μm or more and 5.0 μm or less may be used. In particular, about the copper powder, it is preferred to use, as a main component, a copper powder having an average particle size preferably from 1.0 or more and 5.0 μm or less, more preferably from 1.5 μm or more and 3.0 μm or less. When the copper powder having an average particle size from 1.0 μm or more and 5.0 μm or less is used as a main component, it is allowable to blend a copper powder having an average particle size preferably of 0.1 μm or more and less than 1.0 μm, more preferably from 0.2 μm or more and 0.6 μm or less under the condition that the amount thereof is less than 50% by mass of the entire copper powders.

The copper powder in each of the first and second metal paste compositions is preferably a mixture of copper powders having two average particle sizes of large and small ones, and, in particular, the titanium-component-containing copper powder in the first metal paste composition is preferably a mixture of copper powders having two average particle sizes of large and small ones. About each of the large-size copper powder and the small-size copper powder, preferred particle sizes, and advantageous effects based on the use of the two large-size and small-size copper powders are the same as in the case of the copper powder in the metal paste composition in the process of the first subject matter of the present invention.

The average particle size of the silver powder is not particularly limited, either, and may be the same particle size as silver powders used in conventional pastes. About the silver powder, specifically, the lower limit of the average particle size is preferably 0.1 μm or more, more preferably 0.5 μm or more, and the upper limit is preferably 5.0 μm or less, more preferably 4.0 μm or less.

The use of the copper powder(s) and the silver powder satisfying the above-mentioned ranges of the average particle size can make the screen-printability (of the composition) good to restrain the resultant pattern (metal layer 32) from being forced out (or overflowing). Furthermore, the metal layer 32 can be made dense. When the metal layer 32 can be made dense, the following inconvenience and others can be prevented in the case of forming a plating layer onto the metal layer 32: the (concerned) plating solution penetrates into the metal paste layer 32 and remains in the metal layer 32, whereby the metal layer 32 is discolored; and the plating film swells when the workpiece including the plating film is heated.

The average particle size of the titanium hydride powder in the first metal paste composition is the same as in the case of the titanium hydride powder in the metal paste composition in the process of the first subject matter of the present invention.

The binder contained in the paste composition in the present invention may be the same as in the metal paste composition in the process of the first subject matter of the present invention.

The solvent contained in the paste composition in the present invention may be the same as in the metal paste composition in the process of the first subject matter of the present invention.

(Step of Forming Second Precursor Substrate 112)

In the step of forming a second precursor substrate 112, the first and second metal paste compositions prepared in the above-mentioned step are successively applied onto the above-mentioned sintered nitride ceramic substrate 10 to laminate the first and second metal paste layers 52 and 54 in this order onto the sintered nitride ceramic substrate 10. In this way, the second precursor substrate 112 is formed.

The first and second metal paste layers 52 and 54 are formed by applying the first and second metal paste compositions onto the substrate 10 into a shape turning into the desired shape of the metal layer 32, after the workpiece is fired. The application of the metal paste compositions is attained preferably by printing in order to form a precise wiring. The method for the printing is the same as in the case of the process of the first subject matter of the present invention. After the formation of the first metal paste layer 52, the resultant is dried and then the second metal paste layer 54 is formed. Thereafter, the second metal paste layer 54 may be dried, or after the formation of the first and second metal paste layers 52 and 54, these layers may be dried together. The method for the drying is not particularly limited, and needs only to be a method capable of volatilizing the solvent in each of the paste layers. The method is, for example, a method of drying the workpiece at a temperature of about 80° C. to 120° C. for a period of about 1 minute to 1 hour.

In the present invention for producing the metallized substrate 102, the first metal paste layer 52, which contains the titanium hydride powder, and the second metal paste layer 54, which does not contain this powder, are laminated, and the resultant is fired to form a titanium nitride layer 22 and a layer as the metal layer 32. This titanium nitride layer 22 is formed at the interface between the nitride ceramic sintered body 10 and the metal layer 32 by reaction of the titanium component in the first metal paste layer 52 with the nitrogen component in the sintered nitride ceramic substrate 10.

Furthermore, in the process of the third subject matter of the present invention, the second metal paste layer 54, which contains no titanium hydride powder, is present, whereby the titanium component is restrained from shifting to the front surface of the metal layer 32. Thus, in the same manner as in the process of the first subject matter of the present invention, this matter is combined with the advantageous effects based on the firing under the specified firing condition, which does not involve contamination, to restrain the titanium component further from shifting to the front surface of the metal layer 32. Thus, the metal-platability of the metal layer 32 front surface is made better, so that craters in the front surface of the metal layer 32 can be further decreased. When the titanium nitride layer 22 has been sufficiently formed at the interface between the sintered nitride ceramic substrate 10 and the metal layer 32, the adhesive property of the metal layer 32 becomes still better.

The thickness of the first metal paste layer 52 preferably ranges from 3 μm or more and 150 μm or less, more preferably from 5 μm or more to 70 μm or less. The thickness of the second metal paste layer 54 is preferably from 3 μm or more to 150 μm or less, more preferably from 5 μm or more and 70 μm or less. The ratio of the thickness of the first metal paste layer 52 to that of the second metal paste layer 54 preferably ranges from 0.1 or more to 10 or less (the first metal paste layer 52/the second metal paste layer 54), more preferably from 0.2 μm or more and 5.0 or less.

(Firing Step)

In the firing step, the second precursor substrate 112 formed in the above-mentioned step, which is composed of the sintered nitride ceramic substrate 10, and the first and second metal paste layers 52 and 54, is fired. In this way, a layer as the titanium nitride layer 22 and a layer as the metal layer 32 are formed on the sintered nitride ceramic substrate 10.

In the present invention, the second precursor 112 is held in a heat-resistant container, and vacuum-fired in a non-oxidizing atmosphere, preferably under a pressure of $1.33 \times 10^{-1}$ to $1.33 \times 10^{-5}$ Pa, more preferably $1.33 \times 10^{-2}$ to $1.33 \times 10^{-5}$ Pa while an oxidizing gas is prevented from being mixed thereinto, whereby the titanium component contained in the first metal paste layer 52 is caused to react preferentially with the nitride ceramic constituting the sintered nitride ceramic substrate 10 to form the titanium nitride layer 22 and further the content of titanium in the metal layer 32 obtained after the firing can be set to 2.0% or less by mass and further ½ or less of the amount of titanium contained in the first metal paste layer 52.

The non-oxidizing atmosphere and the heat-resistant container are the same as in the case of the firing step in the process of the first subject matter of the present invention. Advantageous effects based on the use of the non-oxidizing atmosphere and the heat-resistant container are also the same.

In the third subject matter of the present invention, the presence of the second metal paste layer 54, which contains no titanium hydride powder, makes it possible to prevent the shift of titanium in the first metal paste layer 52 to the front surface of the metal layer 32; the use of the above-mentioned especial firing conditions makes it possible to prevent more effectively the shift of titanium in the first metal paste layer 52 to the front surface of the metal layer 32. In this way, exhibited more remarkably are the advantageous effects of the present invention that: the titanium nitride layer 22 is sufficiently formed so that the adhesive property of the metal layer 32 can be made good; the titanium concentration in the metal layer 32 front surface is restrained; the metal-platability of the metal layer 32 front surface is improved; and craters in the metal layer 32 front surface are decreased.

Since the first and second metal paste compositions each contain the silver component, the firing can be performed at a temperature not higher than the melting point (1083° C.) of copper. In order to form a highly precise fine wiring pattern, the firing is performed preferably at a temperature of 800° C. or more and 950° C. or less. When the firing temperature is made high within the firing temperature range, produced is an advantageous effect that voids are decreased in the metal layer 32. It is recommendable that the firing period is appropriately decided in accordance with a (desired) wiring pattern and film thickness, and some other. For the firing, it is sufficient to keep the above-mentioned temperature range for a period from several tens of seconds to one hour.

EXAMPLES

Examples of the Process of the First Subject Matter of the Present Invention, and the Metallized Substrate of the Second Subject Matter Thereof, and Comparative Examples

Example 1

(Production of a Paste Composition)

A mortar was used to pre-mix 9 parts by mass of a copper powder having an average particle size of 0.3 μm (copper powder (b)), 91 parts by mass of a copper powder having an average particle size of 2 μm (copper powder (c)), 23 parts by mass of a silver powder (a) having an average particle size of 0.6 and 3.8 parts by mass of a titanium hydride powder having an average particle size of 5 μm with a vehicle in which poly(alkyl methacrylate) was dissolved in terpineol. Thereafter, a three-roll mill was used to subject the mixture to dispersing treatment to produce a metal paste composition.

(Production of Metallized Substrate)

The produced metal paste composition was printed onto a sintered aluminum nitride substrate (trade name: "SH-30", manufactured by Tokuyama Corp.), 0.64 μm in thickness, by screen printing, and then the resultant was dried at 100° C. for 10 minutes. Next, the workpiece was fired at 850° C. in a vacuum (vacuum degree: $4 \times 10^{-3}$ to $8 \times 10^{-3}$ Pa) for 30 minutes to obtain a metallized substrate. At this time, the substrate was fired in the state that the substrate was held in a setter (heat-resistant container) made of aluminum nitride.

The color tone of the metallized surface of the resultant metallized substrate was light orange. The thickness of the metallized layer (metal layer) was 15 μm. In Table 1 is shown the composition of the above-mentioned paste, and in Table 2 are shown the firing temperature and the firing period for the metallized substrate, and the color tone of the metallized surface. The resultant metallized substrate was analyzed to be evaluated as follows:

<Analysis of the Metallized Substrate (Metal Layer)>

(Analysis of the Composition of the Metal Layer)

The metallized substrate was immersed in a 50% solution of nitric acid in water to dissolve the metal layer. The resultant solution and black precipitation were wholly collected. At this time, in the substrate from which the metal layer was removed, a gold titanium nitride layer remained. To the collected solution were further added hydrofluoric acid and hydrogen peroxide to dissolve the whole of the black precipitation. Thereafter, copper, silver and titanium components in the solution were quantitatively analyzed by inductively coupled plasma emission spectroscopy. The obtained analysis results are shown in Table 3 (the contents thereof relative to 100 parts by mass of Cu).

(Analysis of the Titanium Amount in the Metal Paste Layer Front Surface)

The metal layer front surface was analyzed through a scanning electron microscope (S-3400N, manufactured by Hitachi High-Technologies Corp.) equipped with an energy dispersive X-ray spectrometer (INCA Energy 350, manufactured by Oxford Instruments Co.). At the time of the analysis, the electron accelerating voltage was set to 10 kV. From the mass concentrations of the detected elements, a calculation was made about the ratio (B/A) of the mass concentration (B) of titanium to the total mass concentration (A) of copper and silver. The result is shown in Table 3.

(Check if Titanium Nitride Layer was Formed)

The metallized substrate was buried and wrapped into a resin, and the resultant was polished to produce a sample for observing a cross section of the metallized substrate. The resultant observing sample was observed through the scanning electron microscope to check the thickness of the titanium nitride layer at the interface between the substrate and the metallized layer. The result is shown in Table 3.

<Evaluation of the Metallized Substrate>

(Evaluation of the Forced-Out Quantity from the Metallized Region Edge)

The boundary position between the substrate and the paste layer pattern printed and dried was used as a reference, and then the forced-out quantity of the metallized component forced out from the metallized region edge was evaluated in accordance with the following criterion: any case where the forced-out quantity was less than 15 μm was judged to be good (○); 15 μm or more and less than 50 μm, permissible (Δ); and 50 μm or more, bad (×).

(Evaluation of the Volume Resistivity of the Metallized (Pattern))

The volume resistivity of the metallized pattern formed in the metallized substrate was measured by the four-terminal method. The result is shown in Table 3.

(Evaluation of the Bonding Strength)

The resultant metallized substrate was subjected to nickel electroless plating into a thickness of about 2.5 μm followed by gold electroless plating into a thickness of about 0.4 μm, and then a bonding test was made about the metallized layer. Prepared was a nail head pin made of 42 alloy and having a tip diameter of 1.1 mm, the surface of the tip being plated with nickel. The nail head pin was bonded, into a vertical form, to the metallized pattern, which was apiece 2 mm square, through Pb—Sn solder. This nail head pin was pulled in the vertical direction at a rate of 10 mm/min. The load shown when a breaking-out was caused from the substrate was recorded.

The same test was made 5 times to calculate out the average of the loads. The result is shown in Table 3. The breaking mode when the breaking was caused was checked. The result is shown in Table 3.

Examples 2 to 6, and 9

Each metallized substrate was produced in the same way as in Example 1 except that the composition of the raw material of the paste was changed into a composition shown in Table 1, and then analyzed to be evaluated. The results are shown in Tables 1, 2 and 3.

Example 7

A metallized substrate was produced in the same way as in Example 1 except that the composition of the raw material of the paste was changed into a composition shown in Table 1 and the firing temperature was changed to 900° C., and then analyzed to be evaluated. The results are shown in Tables 1, 2 and 3.

Example 8

A metallized substrate was produced in the same way as in Example 1 except that the composition of the raw material of the paste was changed into a composition shown in Table 1 and the atmosphere for the firing was changed to a mixed gas atmosphere containing 95% by volume of argon and 5% by volume of hydrogen, and then analyzed to be evaluated. The results are shown in Tables 1, 2 and 3.

Comparative Examples 1 to 3

Each metallized substrate was produced in the same way as in Example 1 except that the composition of the raw material of the paste was changed into a composition shown in Table 1, and then analyzed to be evaluated. The results are shown in Tables 1, 2 and 3.

Comparative Example 4

A metallized substrate was produced in the same way as in Example 1 except that a paste composition was produced by using a mortar to pre-mix 90 parts by mass of a Ag—Cu powder (BAg-8, composition: 72% by weight of silver and 28% by weight of copper) having an average particle size of 5.7 µm, and 10 parts by mass of a titanium hydride powder having an average particle size of 5 µm, with a vehicle in which poly(alkyl methacrylate) was dissolved in terpineol, and then using a three-roll mill to subject the mixture to dispersing treatment; and then analyzed to be evaluated. The results are shown in Tables 1, 2 and 3.

Comparative Example 5

A metallized substrate was produced in the same way as in Example 1 except that a paste composition was produced by using a mortar to pre-mix 100 parts by mass of a copper powder having an average particle size of 2 µm (copper powder (c)), 23 parts by mass of a silver powder having an average particle size of 3 µm, and 6.5 parts by mass of a titanium hydride powder having an average particle size of 5 µm with a vehicle in which poly(alkyl methacrylate) was dissolved in terpineol, and then using a three-roll mill to subject the mixture to dispersing treatment; and then analyzed to be evaluated. The results are shown in Tables 1, 2 and 3.

Comparative Example 6

A metallized substrate was produced in the same way as in Example 1 except that when the sintered aluminum nitride substrate on which the paste was printed was fired, the setter made of aluminum nitride was not used, and the firing was performed in the state that the substrate was set directly into the firing furnace; and then analyzed to be evaluated. The color tone of the metallized front surface of the resultant metallized substrate was brown, which had resulted from discoloration. The results of the analysis and evaluation are shown in Tables 1, 2 and 3.

TABLE 1

| | Paste composition (part by mass) | | | | | |
|---|---|---|---|---|---|---|
| | Cu (b) 0.3 µm | Cu (c) 2 µm | Ag (a) | TiH$_2$ | Ratio of mass (a/b) | Ratio of mass (c/b) |
| Example 1 | 9 | 91 | 23 | 3.8 | 2.6 | 10.1 |
| Example 2 | 12 | 88 | 31 | 4.1 | 2.6 | 7.3 |
| Example 3 | 16 | 84 | 41 | 4.3 | 2.6 | 5.3 |
| Example 4 | 9 | 91 | 23 | 2.5 | 2.6 | 10.1 |
| Example 5 | 9 | 91 | 23 | 6.5 | 2.6 | 10.1 |
| Example 6 | 16 | 84 | 41 | 7.4 | 2.6 | 5.3 |
| Example 7 | 16 | 84 | 41 | 4.3 | 2.6 | 5.3 |
| Example 8 | 16 | 84 | 41 | 4.3 | 2.6 | 5.3 |
| Example 9 | 40 | 60 | 23 | 3.8 | 0.6 | 1.5 |
| Comparative Example 1 | 5 | 95 | 11 | 5.9 | 2.2 | 19 |
| Comparative Example 2 | 16 | 84 | 41 | 0.7 | 2.6 | 5.3 |
| Comparative Example 3 | 16 | 84 | 41 | 15.6 | 2.6 | 5.3 |
| Comparative Example 4 | 90 (BAg-8 5.7 µm) | | | 10 | — | — |
| Comparative Example 5 | 0 | 100 (3 µm) | 23 | 6.5 | — | — |
| Comparative Example 6 | 9 | 91 | 23 | 3.8 | 2.6 | 10.1 |

TABLE 2

| | Firing conditions | | | AlN-made airtight container | Color tone of metallized surface |
|---|---|---|---|---|---|
| | Temperature (°C.) | Period (min) | Atmosphere | | |
| Example 1 | 850 | 30 | vacuum | used | light orange |
| Example 2 | 850 | 30 | vacuum | used | light orange |
| Example 3 | 850 | 30 | vacuum | used | light orange |
| Example 4 | 850 | 30 | vacuum | used | light orange |
| Example 5 | 850 | 30 | vacuum | used | light orange |
| Example 6 | 850 | 30 | vacuum | used | light orange |
| Example 7 | 900 | 30 | vacuum | used | light orange |
| Example 8 | 850 | 30 | 95% Ar 5% H$_2$ | used | light orange |
| Example 9 | 850 | 30 | vacuum | used | light orange |
| Comparative Example 1 | 850 | 30 | vacuum | used | light orange |
| Comparative Example 2 | 850 | 30 | vacuum | used | light orange |
| Comparative Example 3 | 850 | 30 | vacuum | used | silver white |
| Comparative Example 4 | 850 | 30 | vacuum | used | silver white |
| Comparative Example 5 | 850 | 30 | vacuum | used | light orange |
| Comparative Example 6 | 850 | 30 | vacuum | not used | brown |

TABLE 3

| | Content relative to 100 parts by mass of Cu (part by mass) | | Titanium content in metal layer | Thickness of | Forced-out from | | Volume resistivity | Bonding strength | |
|---|---|---|---|---|---|---|---|---|---|
| | Ag | Ti | (% by masss) | TiN layer (µm) | pattern | B/A | ($\Omega \cdot m$) | (N) | Breaking mode |
| Example 1 | 22 | 1 | 0.8 | 0.4 | ○ | 0.1 | $6.8 \times 10^{-8}$ | 113 | pin breaking-out or within-solder breaking-out |
| Example 2 | 31 | 1.1 | 0.8 | 0.4 | ○ | 0.11 | $5.2 \times 10^{-8}$ | 108 | pin breaking-out or within-solder breaking-out |
| Example 3 | 41 | 1.2 | 0.8 | 0.4 | ○ | 0.09 | $4.4 \times 10^{-8}$ | 115 | pin breaking-out or within-solder breaking-out |

TABLE 3-continued

|  | Content relative to 100 parts by mass of Cu (part by mass) | | Titanium content in metal layer (% by masss) | Thickness of TiN layer (μm) | Forced-out from pattern | B/A | Volume resistivity (Ω·m) | Bonding strength (N) | Breaking mode |
|---|---|---|---|---|---|---|---|---|---|
|  | Ag | Ti |  |  |  |  |  |  |  |
| Example 4 | 24 | 0.7 | 0.6 | 0.2 | ○ | 0.05 | $5.8 \times 10^{-8}$ | 112 | pin breaking-out or within-solder breaking-out |
| Example 5 | 23 | 1.1 | 0.9 | 0.7 | ○ | 0.06 | $6.6 \times 10^{-8}$ | 113 | pin breaking-out or within-solder breaking-out |
| Example 6 | 41 | 1.3 | 0.9 | 0.7 | Δ | 0.09 | $5.8 \times 10^{-8}$ | 116 | pin breaking-out or within-solder breaking-out |
| Example 7 | 41 | 1.3 | 0.9 | 0.4 | ○ | 0.13 | $4.3 \times 10^{-8}$ | 111 | pin breaking-out or within-solder breaking-out |
| Example 8 | 40 | 1.3 | 0.9 | 0.4 | ○ | 0.12 | $5.2 \times 10^{-8}$ | 115 | pin breaking-out or within-solder breaking-out |
| Example 9 | 22 | 1 | 0.8 | 0.4 | ○ | 0.1 | $6.3 \times 10^{-8}$ | 113 | pin breaking-out or within-solder breaking-out |
| Comparative Example 1 | 11 | 0.8 | 0.7 | 0.6 | ○ | 0.13 | $2.0 \times 10^{-7}$ | 114 | pin breaking-out or within-solder breaking-out |
| Comparative Example 2 | 40 | 0.1 | 0.1 | 0 | ○ | 0.01 | $2.7 \times 10^{-8}$ | 43 | peeling at interface between substrate and metallized layer |
| Comparative Example 3 | 40 | 5.3 | 3.6 | 0.9 | × | 0.09 | $9.4 \times 10^{-8}$ | 116 | pin breaking out or within-solder breaking-out |
| Comparative Example 4 | 259 | 18 | 4.8 | 0.9 | × | 0.11 | $9.1 \times 10^{-8}$ | 113 | pin breaking-out or within-solder breaking-out |
| Comparative Example 5 | 23 | 1.2 | 1 | 0.7 | ○ | 0.06 | $8.2 \times 10^{-8}$ | 109 | pin breaking out or within-solder breaking-out |
| Comparative Example 6 | 23 | 2.1 | 1.7 | 0.2 | ○ | 2.4 | $7.1 \times 10^{-8}$ | 88 | peeling at interface between metallized layer and solder |

In the paste composition of Comparative Example 1, the content by percentage of the silver powder was small, and the silver content by percentage in the metal layer in the metallized substrate was small. Thus, the volume resistance of the metallized pattern of the resultant metallized substrate was high. In the paste composition of Comparative Example 2, the content by percentage of the titanium hydride powder was small, and it was not observed that a titanium nitride layer was formed in the metallized substrate. Thus, the bonding strength of the metallized substrate was small. In the paste composition of Comparative Example 3, the content by percentage of the titanium hydride powder was large, and the titanium content by percentage in the metal layer in the metallized substrate was large. Thus, the quantity of the material forced out from the metallized pattern was large. In the paste composition of Comparative Example 4, the Ag—Cu powder (72% by weight of silver and 28% by weight of copper) was used, and the silver content by percentage in the metal layer in the metallized substrate was very large. Thus, the quantity of the material forced out from the metallized pattern was large. In the metal paste composition of Comparative Example 5, the particle size of the silver powder was large, and the copper powder was made only of the large-size particles. Thus, it appears that the metal layer was not sufficiently fired, and the volume resistivity was larger than the values of the working examples of the present invention. In Comparative Example 6, the firing was performed without using any setter made of aluminum nitride. Thus, the titanium component shifted to the front surface of the metal layer, so that the titanium content by percentage in the metal paste layer was large, the thickness of the titanium nitride layer was small, and further the value of the ratio B/A was large. As a result, the bonding strength of the metal layer was small.

Examples of the Process of the Third Subject Matter of the Present Invention, and the Metallized Substrate of the Fourth Subject Matter Thereof, and Comparative Examples Example 10

(Production of Paste Composition 1)

A mortar was used to pre-mix 16 parts by mass of a copper powder having an average particle size of 0.3 μm, 84 parts by mass of a copper powder having an average particle size of 2 μm, 41 parts by mass of a silver powder having an average particle size of 0.6 μm, and 4.4 parts by mass of a titanium hydride powder having an average particle size of 5 μm, with a vehicle in which poly(alkyl methacrylate) was dissolved in terpineol. Thereafter, a three-roll mill was used to subject the mixture to dispersing treatment to produce a metal paste composition 1.

(Production of Paste Composition 2)

A mortar was used to pre-mix 16 parts by mass of a copper powder having an average particle size of 0.3 μm, 84 parts by mass of a copper powder having an average particle size of 2 μm, and 41 parts by mass of a silver powder having an average particle size of 0.6 μm, with a vehicle in which poly(alkyl methacrylate) was dissolved in terpineol. Thereafter, a three-roll mill was used to subject the mixture to dispersing treatment to produce a metal paste composition 2.

(Production of Metallized Substrate)

The produced metal paste composition 1 was printed onto a sintered aluminum nitride substrate (trade name: "SH-30", manufactured by Tokuyama Corp.), 0.64 μm in thickness, by screen printing, and then the resultant was dried at 100° C. for 10 minutes to form a first paste layer. At this time, from a change in the mass of the substrate before and after the formation of the first paste layer, the mass of the first paste layer formed on the substrate was calculated out. Next, the metal paste composition 2 was stacked and printed onto the first paste layer by screen printing, and then the resultant was dried at 100° C. for 10 minutes to form a second paste layer. At this time, from a change in the mass of the substrate before and after the formation of the second paste layer, the mass of the second paste layer formed on the substrate was calculated out. From the calculated masses of the first and second paste layers, the amount of the titanium hydride powder was calculated out under a condition that the total amount of the copper powders and the silver powders in the first and second paste layers was regarded as 100 parts by mass. As a result, the amount was 1.5 parts by mass.

Next, the workpiece was fired at 850° C. in a vacuum (vacuum degree: $4 \times 10^{-3}$ to $8 \times 10^{-3}$ Pa) for 30 minutes to obtain a metallized substrate. At this time, the substrate was fired in the state that the substrate was held in a setter (airtight container) made of aluminum nitride. The color tone of the metallized surface of the resultant metallized substrate was light orange. The thickness of the metallized layer (metal layer) was 25 µm. In Table 4 are shown the respective compositions of the first and second paste compositions 1 and 2, and in Table 5 are shown the firing temperature and the firing period for the metallized substrate, and the color tone of the metallized surface. The resultant metallized substrate was analyzed to be evaluated, as will be described below.

Examples 11 to 16

Each metallized substrate was produced in the same way as in Example 10 except that the composition of the raw material of the paste was changed into a composition shown in Table 4, and then analyzed to be evaluated. The results are shown in Tables 4, 5 and 6.

Comparative Example 7

A metallized substrate was produced in the same way as in Example 10 except that when the sintered aluminum nitride substrate on which the paste was printed was fired, the setter made of aluminum nitride was not used, and the firing was performed in the state that the substrate was set directly into the firing furnace; and then analyzed to be evaluated. The results are shown in Tables 4, 5 and 6.

Comparative Examples 8 to 10

Each metallized substrate was produced in the same way as in Example 10 except that the composition of the raw material of the paste was changed into a composition shown in Table 4, and then analyzed to be evaluated. The results are shown in Tables 4, 5 and 6.

Comparative Example 11

(Production of Paste Composition)

A mortar was used to pre-mix 90 parts by mass of a Ag—Cu powder (BAg-8, composition: 72% by weight of silver and 28% by weight of copper) having an average particle size of 5.7 µm, and 10 parts by mass of a titanium hydride powder having an average particle size of 5 µm, with a vehicle in which poly(alkyl methacrylate) was dissolved in terpineol, and then a three-roll mill was used to subject the mixture to dispersing treatment. In this way, a paste composition was produced.

(Production of Metallized Substrate)

The produced paste composition was printed onto a sintered aluminum nitride substrate (trade name: "SH-30", manufactured by Tokuyama Corp.), 0.64 µm in thickness, by screen printing, and then the resultant was dried at 100° C. for 10 minutes to form a paste layer. Thereafter, the workpiece was fired in the same way as in Example 10 to produce a metallized substrate. The metallized substrate was analyzed to be evaluated in the same way as in Example 10. The results are shown in Tables 4, 5 and 6.

<Analysis of Each of the Metallized Layers (Each of the Metal Layers)>

(Analysis of the Metal Layer Composition)

The composition of each of the metal layers (related to the third subject matter) was analyzed in the same way as in the case of the working examples of the first subject matter of the present invention. The obtained analysis results are shown in Table 6 (the contents (of Ag and Ti) relative to 100 parts by mass of Cu).

(Analysis of the Titanium Amount in the Front Surface of the Metal Paste Layer)

The titanium amount in the metal layer front surface was analyzed in the same way as in the case of the working examples of the first subject matter of the present invention. The results are shown in Table 6.

(Check as to Whether or not a Titanium Nitride Layer was Formed)

In the same way as in the working examples of the first subject matter of the present invention, it was checked whether or not a titanium nitride layer was formed. The results are shown in Table 6.

<Evaluation of Each of the Metallized Substrates>

(Evaluation of Craters in its Metallized Layer Front Surface)

The metal layer front surface of the metallized substrate was observed through a laser scanning microscope to evaluate the frequency of generations of crater-form defects (hereinafter also referred to merely as the craters) in the metal layer front surface. The diameter of a minimum circle contained inside any crater was defined as the size of the crater. The sizes (of the above-mentioned craters), and the respective generation numbers thereof were counted. Any case where the number of craters having a size of 10 µm or more was less than 5 per millimeters square was judged to be good (○); the number 5 or more, and less than 20, acceptable (Δ); and the number was 20 or more, poor (X). The results are shown in Table 6.

(Evaluation of the Forced-Out Quantity (of the Metallized Component) from the Edge of the Metal Layer)

The forced-out quantity (of the metallized component) from the edge of the metal layer was evaluated in the same way as in the case of the working examples of the first subject matter of the present invention. The results are shown in Table 6.

(Evaluation of the Volume Resistivity of the Metallized (Pattern))

The volume resistivity of the metallized (pattern) was measured in the same way as in the case of the working examples of the first subject matter of the present invention. The results are shown in Table 6.

(Evaluation of the Bonding Strength)

The bonding strength (of the metallized layer) was evaluated in the same way as in the case of the working examples of the first subject matter of the present invention. The results are shown in Table 6. The breaking mode when breaking-out was caused (in the sample) was checked. The results are shown in Table 6.

TABLE 4

| | Paste composition 1 (part by mass) | | | | | Paste composition 2 (part by mass) | | | | |
|---|---|---|---|---|---|---|---|---|---|---|
| | Cu 0.3 mm | Cu 2 mm | Ag 0.6 mm | Ag 3 mm | TiH$_2$ | Cu 0.3 mm | Cu 2 mm | Ag 0.6 mm | Ag 3 mm | TiH$_2$ |
| Example 10 | 16 | 84 | 41 | 0 | 4.4 | 16 | 84 | 41 | 0 | 0 |
| Example 11 | 16 | 84 | 41 | 0 | 7.4 | 16 | 84 | 41 | 0 | 0 |
| Example 12 | 0 | 100 | 41 | 0 | 4.4 | 0 | 100 | 41 | 0 | 0 |
| Example 13 | 0 | 100 | 41 | 0 | 7.4 | 0 | 100 | 41 | 0 | 0 |
| Example 14 | 0 | 100 | 56 | 0 | 4.8 | 0 | 100 | 41 | 0 | 0 |
| Example 15 | 47 | 53 | 41 | 0 | 4.4 | 16 | 84 | 41 | 0 | 0 |
| Example 16 | 9 | 91 | 23 | 0 | 3.8 | 16 | 84 | 41 | 0 | 0 |
| Comparative Example 7 | 16 | 84 | 41 | 0 | 4.4 | 16 | 84 | 41 | 0 | 0 |
| Comparative Example 8 | 16 | 84 | 41 | 0 | 0 | 16 | 84 | 41 | 0 | 0 |
| Comparative Example 9 | 16 | 84 | 41 | 0 | 15.6 | 16 | 84 | 41 | 0 | 15.6 |
| Comparative Example 10 | 0 | 100 | 41 | 0 | 7.4 | 0 | 100 | 0 | 0 | 0 |
| Comparative Example 11 | 90 (BAg-8 5.7 μm) | | | | 10 | | | | | |

TABLE 5

| | Ratio of paste layer composition TiH$_2$/(Cu + Ag) (×10$^{-2}$) | Firing conditions Temperature (° C.) | Period (min) | Atmosphere | AlN-made airtight container | Color tone of metallized surface |
|---|---|---|---|---|---|---|
| Example 10 | 1.5 | 850 | 30 | vacuum | used | light orange |
| Example 11 | 2.4 | 850 | 30 | vacuum | used | light orange |
| Example 12 | 1.5 | 850 | 30 | vacuum | used | light orange |
| Example 13 | 2.5 | 850 | 30 | vacuum | used | light orange |
| Example 14 | 1.5 | 850 | 30 | vacuum | used | light orange |
| Example 15 | 1.4 | 850 | 30 | vacuum | used | light orange |
| Example 16 | 1.5 | 850 | 30 | vacuum | used | light orange |
| Comparative Example 7 | 1.5 | 850 | 30 | vacuum | not used | yellow |
| Comparative Example 8 | 0 | 850 | 30 | vacuum | used | light orange |
| Comparative Example 9 | 11.1 | 850 | 30 | vacuum | used | silver white |
| Comparative Example 10 | 2.8 | 850 | 30 | vacuum | used | light orange |
| Comparative Example 11 | 11.1 | 850 | 30 | vacuum | used | silver white |

TABLE 6

| | Content relative to 100 parts by mass of Cu (part by mass) | | Titanium content in metal layer (% by mass) | Thickness of TiN layer (μm) | Whether crater is generated | Forced-out from pattern | B/A | Volume resistivity (Ω · m) | Bonding strength (N) | Breaking mode |
|---|---|---|---|---|---|---|---|---|---|---|
| | Ag | Ti | | | | | | | | |
| Example 10 | 41 | 0.8 | 0.6 | 0.3 | ○ | ○ | 0.03 | 3.1 × 10$^{-8}$ | 112 | pin breaking-out or within-solder breaking-out |
| Example 11 | 41 | 1.1 | 0.8 | 0.5 | ○ | ○ | 0.07 | 4.3 × 10$^{-8}$ | 116 | pin breaking-out or within-solder breaking-out |
| Example 12 | 40 | 0.9 | 0.6 | 0.3 | ○ | ○ | 0.05 | 3.7 × 10$^{-8}$ | 111 | pin breaking-out or within-solder breaking-out |
| Example 13 | 41 | 1.0 | 0.7 | 0.5 | ○ | ○ | 0.07 | 4.1 × 10$^{-8}$ | 114 | pin breaking-out or within-solder breaking-out |
| Example 14 | 48 | 1.3 | 0.9 | 0.3 | ○ | ○ | 0.04 | 3.4 × 10$^{-8}$ | 111 | pin breaking-out or within-solder breaking-out |
| Example 15 | 41 | 0.9 | 0.6 | 0.3 | ○ | ○ | 0.04 | 3.3 × 10$^{-8}$ | 113 | pin breaking-out or within-solder breaking-out |
| Example 16 | 32 | 0.7 | 0.5 | 0.3 | ○ | ○ | 0.04 | 4.8 × 10$^{-8}$ | 114 | pin breaking-out or within-solder breaking-out |
| Comparative Example 7 | 39 | 1.0 | 0.7 | 0.2 | ○ | ○ | 0.22 | 3.3 × 10$^{-8}$ | 89 | peeling at interface between metallized layer and solder |
| Comparative Example 8 | 41 | 0 | 0 | 0 | ○ | ○ | 0.09 | 2.5 × 10$^{-8}$ | | peeling between substrate and metal layer |
| Comparative Example 9 | 40 | 9.4 | 6.3 | 1.0 | ○ | x | 0.12 | 1.2 × 10$^{-7}$ | 116 | pin breaking-out or within-solder breaking-out |
| Comparative Example 10 | 23 | 1.2 | 1 | 0.7 | ○ | ○ | 0.05 | 1.1 × 10$^{-7}$ | 82 | breaking in metallized layer |
| Comparative Example 11 | 259 | 18 | 4.8 | 0.9 | ○ | x | 0.11 | 9.1 × 10$^{-8}$ | 113 | pin breaking-out or within-solder breaking-out |

In Comparative Example 7, the firing was performed without using any setter made of aluminum nitride. Thus, the titanium component shifted to the front surface of the metal layer, so that the titanium content by percentage in the metal paste layer was large, the thickness of the titanium nitride layer was small, and further the value of the ratio B/A was large. As a result, the bonding strength of the metal layer was small. In the producing process of Comparative Example 8, the paste composition 1 contained no titanium hydride powder; thus, in the resultant metallized substrate, the formation of a titanium nitride layer was not recognized. For this reason, the bonding strength of the metallized substrate was very small. Thus, when the metallized substrate was to be subjected to electroless plating with nickel, the metallized layer was peeled in the step of pre-treatment for the plating so that no test for bonding strength was able to be made. In the producing process of Comparative Example 9, the content by percentage of the titanium hydride powder in the paste composition 1 was large so that the titanium content by percentage was large in the metal layer in the resultant metallized substrate. Thus, the forced-out quantity of the material from the metallized pattern was large, and the volume resistivity was also high. In the producing process of Comparative Example 10, the second paste layer contained no silver powder so that the bonding strength was small. The breaking mode was also an in-layer breaking mode. The volume resistivity was also high. In the producing process of Comparative Example 11, the Ag—Cu (72% by weight of silver and 28% by weight of copper) was used as the paste composition, and the silver content by percentage in the metal layer in the resultant metallized substrate was very large. Thus, the quantity of the material forced out from the metallized pattern was large.

INDUSTRIAL APPLICABILITY

The metallized substrates 100 and 102 produced by the first and third subject matters of the present invention, respectively, are each used as a substrate on which a semiconductor element is to be mounted.

The invention claimed is:

1. A process for producing a metallized substrate in which a sintered nitride ceramic substrate and a metal layer having a predetermined shape that covers a partial area of a surface of the substrate are bonded to each other through a titanium nitride layer having a thickness of 0.2 μm or more and 0.7 μm or less, comprising:
    a step of preparing a metal paste composition comprising 100 parts by mass of a copper powder, 20 parts by mass or more and 60 parts by mass or less of a silver powder, and 2.0 parts by mass or more and 7.5 parts by mass or less of a titanium hydride powder, the copper powder being a mixed powder of a copper powder having an average particle size of 1.0 μm or more and 5.0 μm or less, and a copper powder having an average particle size of 0.2 μm or more and 0.6 μm or less, the silver powder having an average particle size of 0.1 μm or more and 1.0 μm or less, and the titanium hydride powder having an average particle size of 1.0 μm or more and 7.0 μm or less,
    a first-precursor-substrate-forming step of applying the metal paste composition to the sintered nitride ceramic substrate, thereby forming a first precursor substrate having the sintered nitride ceramic substrate, and a metal paste layer comprising the metal paste composition, which is formed over the substrate, and which has a shape turning into the above-mentioned predetermined shape after the precursor substrate is fired, and
    a firing step of holding the first precursor substrate in a heat-resistant container arranged in a firing furnace, and firing the substrate at a temperature of 800° C. or more and 950° C. or less and under a pressure of $1.33 \times 10^{-5}$ Pa or more and $1.33 \times 10^{-2}$ Pa or less, such that a titanium nitride layer is formed on the sintered nitride ceramic substrate and a metal layer is formed on the titanium nitride layer,
    wherein in the firing step, the titanium component contained in the metal paste layer is caused to react preferentially with a nitride ceramic that constitutes the sintered nitride ceramic substrate, thereby forming the titanium nitride layer; and further the content of titanium in the metal layer obtained after the firing is set to 2.0% by mass or less, and further is set to ½ or less of the amount of titanium contained in the metal paste layer.

2. The process according to claim 1, wherein in the metal paste composition, the ratio (a/b) of the mass (a) of the silver powder having the average particle size of 0.1 μm or more and 1.0 μm or less, to the mass (b) of the copper powder having the average particle size of 0.2 μm or more and 0.6 μm or less, is 0.4 or more and 5.0 or less, and the ratio (c/b) of the mass (c) of the copper powder the having average particle size of 1.0 μm or more and 5.0 μm or less to the mass (b) of the copper powder having the average particle size of 0.2 μm or more and 0.6 μm or less, is 0.5 or more and 15.0 or less.

3. A process for producing a metallized substrate in which a sintered nitride ceramic substrate and a metal layer having a predetermined shape that covers a partial area of a surface of the substrate are bonded to each other through a titanium nitride layer having a thickness of 0.2 μm or more and 0.7 μm or less, comprising:
    a step of preparing a first metal paste composition comprising 100 parts by mass of a copper powder, 20 parts by mass or more and 60 parts by mass or less of a silver powder, and 2.0 parts by mass or more and 10.0 parts by mass or less of a titanium hydride powder, the copper powder being a mixed powder of a copper powder having an average particle size of 1.0 μm or more and 5.0 μm or less, and a copper powder having an average particle size of 0.2 μm or more and 0.6 μm or less, the silver powder having an average particle size of 0.1 μm or more and 1.0 μm or less, and the titanium hydride powder having an average particle size of 1.0 μm or more and 7.0 μm or less,
    a step of preparing a second metal paste composition containing a copper powder and a silver powder but containing no titanium component;
    a second-precursor-substrate-forming step of applying, to the sintered nitride ceramic substrate, the first metal paste composition and the second metal paste composition successively, thereby forming a second precursor substrate having the sintered nitride ceramic substrate, and a metal paste layer which is formed over the substrate, which has a shape turning into the above-mentioned predetermined shape after the precursor substrate is fired, and which comprises a laminate of a first metal paste layer comprising the first metal paste composition, and a second metal paste layer comprising the second metal paste composition, and
    a firing step of holding the second precursor substrate in a heat-resistant container arranged in a firing furnace, and then firing the substrate at a temperature of 800° C. or more and 950° C. or less under a pressure of $1.33 \times 10^{-5}$ Pa or more and $1.33 \times 10^{-2}$ Pa or less, such that a titanium nitride layer is formed on the sintered nitride ceramic substrate and a metal layer is formed on the titanium nitride layer, wherein in the firing step, the titanium component contained in the first metal paste layer is caused to react preferentially with a nitride ceramic that constitutes the sintered nitride ceramic substrate, thereby forming the titanium nitride layer; and further the content of titanium in the metal layer obtained after the firing is set to 2.0% by mass or less, and further is set to ½ or less of the amount of titanium contained in the first metal paste layer.

4. The process according to claim 3, wherein in the first metal paste composition, the ratio (a/b) of the mass (a) of the silver powder having the average particle size of 0.1 µm or more and 1.0 µm or less, to the mass (b) of the copper powder having the average particle size of 0.2 µm or more and 0.6 µm or less, is 0.4 or more and 5.0 or less, and the ratio (c/b) of the mass (c) of the copper powder having the average particle size of 1.0 µm or more and 5.0 µm or less, to the mass (b) of the copper powder having the average particle size of 0.2 µm or more and 0.6 µm or less, is 0.5 or more and 15.0 or less.

\* \* \* \* \*